United States Patent [19]

Hayakawa et al.

[11] Patent Number: 4,841,533
[45] Date of Patent: Jun. 20, 1989

[54] SEMICONDUCTOR LASER DEVICE HAVING A GRADED INDEX WAVEGUIDE

[75] Inventors: Toshiro Hayakawa, Nara; Takahiro Suyama, Tenri; Masafumi Kondo, Tenri; Kohsei Takahashi, Tenri; Saburo Yamamoto, Nara, all of Japan

[73] Assignee: Sharp Kabushiki Kaisha, Osaka, Japan

[21] Appl. No.: 920,585

[22] Filed: Oct. 17, 1986

[30] Foreign Application Priority Data

Oct. 24, 1985 [JP] Japan .................. 60-240162

[51] Int. Cl.$^4$ .............................. H01S 3/19
[52] U.S. Cl. ...................... 372/45; 357/16; 357/17
[58] Field of Search ........... 372/43, 44, 45; 357/16, 357/17, 4 SL, 90

[56] References Cited

U.S. PATENT DOCUMENTS

| 4,512,022 | 4/1985 | Tsang | 372/45 |
|---|---|---|---|
| 4,573,161 | 2/1986 | Sakai et al. | 372/45 |
| 4,599,728 | 7/1986 | Alavi et al. | 372/45 |
| 4,616,241 | 10/1986 | Biefeld et al. | 372/45 |

FOREIGN PATENT DOCUMENTS 0103415  8/1983  European Pat. Off. .
2170044 12/1984  United Kingdom .

OTHER PUBLICATIONS

Tsang, *Extremely Low Threshold (AlGa) As Modified . . .* Bell Labs, New Jersey, 1981.

Iwamura et al., *Musashino Electrical Comm. Lab.*, Nippon Telegraph & Telephone Co., 6th Jan. 1983.

Matsumoto et al., *Japanese Journal of Applied Physics* vol. 16, No. 8, 1977.

Oomura et al., *IEEE Journal of Quantum Electronics*, vol. QE-20, No. 8, 1944.

Dutta, *Calculated Threshold Current of GaAs Quantum Well Lasers,* Bell Labs, New Jersey, 1982.

Higuchi et al., *LSI Research & Development Laboratory* Mitsubishi Electric Corp., Leakage Current in p-Substrate 1984.

Hirano et al., *Applied Physics, Lett.*, vol. 43, No. 2, 187-189, 1983.

T. Hayakawa, T. Suyama, K. Takahashi et al. "Low current threshold AlGaAs visible laser diodes with an (AlGaAs)$_m$ (GaAs)$_n$ superlattice quantum well." Appl. Phys. Lett., 49 (11), 1986.

Primary Examiner—William L. Sikes
Assistant Examiner—B. R. R. Holloway
Attorney, Agent, or Firm—Irell & Manella

[57] ABSTRACT

A semiconductor laser device containing a laser oscillation-operating area comprising a superlatticed quantum well region which is composed of layers of GaAs alternating with layers of $Al_xGa_{1-x}As$ ($0<x\leq1$), where each of the layers has a thickness of several molecular layers or less;

optical guiding layers consisting of $Al_yGa_{1-y}As$ ($x\leq y\leq1$) sandwiching the quantum well region, where the AlAs mole fraction varies continuously; and cladding layers covering the optical guiding layers.

3 Claims, 3 Drawing Sheets

SEMICONDUCTOR LASER DEVICE HAVING A GRADED INDEX WAVEGUIDE

BACKGROUND OF THE INVENTION

1. Field of the invention

This invention relates to a semiconductor laser device which oscillates laser light with an oscillation wavelength in the visible region, especially, a high quality semiconductor laser device which can be readily produced by molecular beam epitaxy.

2. Description of the prior art

In recent years, single thin crystal film growth techniques such as molecular beam epitaxy (MBE) and metal organic-chemical vapor deposition (MO-CVD), have been rapidly advanced By these growth techniques, it is possible to obtain epitaxial growth layers of extreme thinness, on the order of 10 Å. Due to the progress in these crystal growth techniques, it is possible to make laser devices based on device structures having very thin layers, which could not be easily manufactured by conventional liquid phase epitaxy. A typical example of these laser devices is the quantum well (QW) laser, in which the active layer 20 has a thickness of 100 Å or less resulting in the formation of quantum levels therein, whereas the active layer of the conventional double-heterostructure (DH) laser has a thickness of several hundreds of angstroms or more. Thus, this QW laser is advantageous over the conventional DH laser in that the threshold current level is reduced, the temperature characteristics are excellent, and the transient characteristics are excellent. This has been reported by W. T. Tsang, Applied Physics Letters, vol. 39, No. 10, pp. 786 (1981); N. K. Dutta, Journal of Applied Physics, vol. 53, No. 11, pp. 7211 (1982); and H. Iwamura, T. Saku, T. Ishibashi, K. Otsuka, Y. Horikoshi, Electronics Letters, vol. 19, No. 5, pp. 180 (1983).

As mentioned above, by the use of single thin crystal film growth techniques such as MBE and MO-CVD, it is now possible to put high quality semiconductor lasers having a new multiple-layered structure into practical use.

A typical structure for conventional QW lasers is the AlGaAs laser with a graded-index separate-confinement heterostructure (GRIN-SCH). The AlAs mole fraction in the active region of these semiconductor lasers is shown in FIG. 5. The GaAs-GaAlAs lasers containing GaAs as a quantum well layer is produced by MBE as follows: The GRIN region 42 is grown by a decrease in the Al cell temperature from the outer surface of the cladding layer 41, which constitutes a double-heterostructure made by sandwiching the active layer between the cladding layers. Then, by closing the Al cell shutter, the GaAs quantum well layer 43 is grown. Thereafter, the Al cell shutter is opened again and the Al cell temperature is raised so as to grow the GRIN region 44 on the GaAs quantum well layer 43, followed by growing the cladding layer 45 on the GRIN region 44. Therefore, by regulating the Al cell temperature and the opening and closing of the shutter, the crystal growth can be achieved with the use of only one Al cell, which means that the MBE apparatus required is not complicated. However, when this structure is applied to a visible-light laser device having an AlGaAs quantum well layer therein, the AlAs mole fraction in the active region is as shown in FIG. 6, and two Al cells must be used. One of the Al cells is opened so as to give an AlAs mole fraction of 0.3, and the other Al cell controls the cladding layers 3 and 7 and the GRIN regions 4 and 6. This is why two Al cells are required. Moreover, bulk AlGaAs is used as a quantum well layer, which causes difficulties in maintaining the radiation efficiency at a high level.

SUMMARY OF THE INVENTION

The semiconductor laser device of this invention, which overcomes the above-discussed and numerous other disadvantages and deficiencies of the the prior art, contains a laser oscillation-operating area which comprises: a superlatticed quantum well region which is composed of alternate layers consisting of GaAs layers and thin $Al_xGa_{1-x}As$ ($0 < x \leq 1$) layers, each of said layers having a thickness of several molecular layers or less, optical guiding layers sandwiching said superlatticed quantum well region therebetween, the AlAs oole fraction (i.e., x) of each of said optical guiding layers being continuously varied, and cladding layers superposed on said optical guiding layers, respectively.

In a preferred embodiment, the whole area of each of said optical guiding layers is constituted by a GRIN region, the AlAs mole fraction of which varies according to the parabolic distribution. Alternatively, the area of each of said optical guiding layers positioned in the vicinity of the interface between the optical guiding layers and the cladding layers is constituted by a GRIN region, the AlAs mole fraction of which is greatly different and the AlAs mole fraction in the area of each of said optical guiding layers positioned in the vicinity of said quantum well region is the same as that in said quantum well region.

The method for the production of the semiconductor laser device of this invention comprises steps of: (1) growing optical guiding layers, the AlAs mole fraction of which is continuously varied, by molecular beam epitaxy, (2) repeatedly opening and closing of the shutter of an Al cell to grow alternate layers consisting of a plurality of GaAs layers, each of which has a thickness of several molecular layers or less, and a plurality of $Al_xGa_{1-x}As$ ($0 < x \leq 1$) layers, each of which has a thickness of several molecular layers or less, by molecular beam epitaxy, resulting in a superlatticed quantum well region in a manner to be sandwiched between said optical guiding layers, and (3) growing cladding layers, respectively, on the outer sides of said optical guiding layers by molecular beam epitaxy, said optical guiding layers, said quantum well region and said cladding layers constituting the laser oscillation-operating area of said semiconductor laser device.

In a preferred embodiment, the whole area of each of said optical guiding layers is constituted by a GRIN region, the AlAs mole fraction of which varies according to the parabolic distribution. Alternatively, the area of each of said optical guiding layers positioned in the vicinity of the interface between the optical guiding layers and the cladding layers is constituted by a GRIN region, the AlAs mole fraction of which is greatly different and the AlAs mole fraction in the area of each of said optical guiding layers positioned in the vicinity of said quantum well region is the same as that in said quantum well region.

Thus, the invention described herein makes possible the objects of (1) providing a high quality semiconductor laser device which oscillates a visible light at a low threshold current level; (2) providing a semiconductor laser device which can be produced by a single Al cell by utilizing controlability in the layer thickness by molecular beam epitaxy and (3) providing a method for the production of the above-mentioned laser device.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

The quantum well semiconductor laser device of this invention produces a visible light, which comprises optical guiding layers including GRIN regions therein and a quantum well layer sandwiched between the optical guiding layers. The quantum well layer is constituted by a superlatticed semiconductor layer which is composed of alternate layers consisting of a plurality of GaAs layers and a plurality of AlGaAs layers, or a plurality of GaAs layers and a plurality of AlAs layers, and moreover each layer constituting the superlatticed semiconductor layer is extremely thin (e.g., several angstroms), so that the semiconductor laser device of this invention can be produced using a single Al cell by molecular beam epitaxy. The abovementioned structure of the semiconductor laser device of this invention is quite different from a conventional semiconductor laser device comprising a quantum well layer which is composed of an AlGaAs alone. Moreover, although carrier theoretically exists under a three-dimensional condition in a superlattice, since the quantum well structure is formed by semiconductor layers having an energy-band structure which is different from that of bulk crystals, the carrier tends to exist under a two-dimensional condition within the superlattice, which allows the lowering of threshold current level in the short wavelength zone.

EXAMPLE 1

Figure 1:
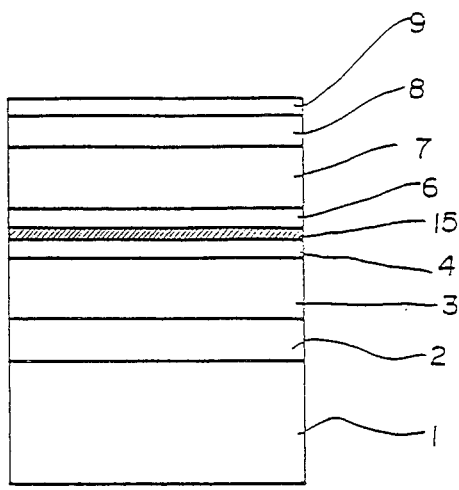
FIG. 1 is a front sectional view showing a semiconductor laser device of this invention.

FIG. 1 shows a semiconductor laser device of this invention, which is produced as follows: On an n-GaAs substrate (carrier density $Si=10^{18}$ cm$^{-3}$) 1, an n-GaAs buffer layer ($Si=10^{18}$ cm$^{-3}$, the thickness thereof being 0.5 μm) 2, an n-$Al_{0.7}Ga_{0.3}As$ cladding layer ($Si=10^{18}$ cm$^{-3}$, the thickness thereof being 1.5 μm) 3, a non-doped $Al_xGa_{1-x}As$ GRIN layer (the thickness thereof being 0.2 μm) 4, a non-doped $GaAs/Al_{0.28}Ga_{0.72}As$ superlatticed quantum well layer 15 with a thickness of twenty six molecular layers thickness or 73.58 Å (which is composed of alternate layers consisting of four GaAs layers with a five molecular layer thickness each and three $Al_{0.28}Ga_{0.72}As$ layers with a two molecular layer thickness each), a non-doped $Al_xGa_{1-x}As$ GRIN layer (the thickness thereof being 0.2 μm) 6, a p-$Al_{0.7}Ga_{0.3}As$ cladding layer ($Be=10^{18}$ cm$^{-3}$, the thickness thereof being 1.5 μm) 7, a p-GaAs cap layer ($Be=10^{18}$ cm$^{-3}$, the thickness thereof being 0.5 μm) 8, and an n-$Al_{0.5}Ga_{0.5}As$ current blocking layer ($Si=10^{18}$ cm$^{-3}$, the thickness thereof being 0.3 μm) 9 are successively grown by molecular beam epitaxy.

Figure 2:
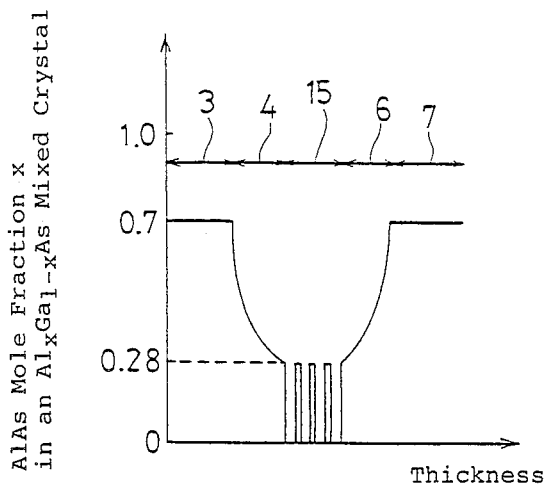
FIG. 2 is a graph showing the AlAs mole fraction (i.e., x) in an $Al_xGa_{1-x}As$ mixed crystal in the active region of the semiconductor laser device shown in FIG. 1.

FIG. 2 shows the AlAs mole fraction (i.e., x) in an $Al_xGa_{1-x}As$ mixed crystal in the vicinity of the quantum well layer 15. After the n-$Al_{0.7}Ga_{0.3}As$ cladding layer 3 is grown, the shutter of a Si cell for supplying Si molecules is closed and the temperature of the Al cell for supplying Al molecules is lowered, resulting in the GRIN region 4 functioning as an optical guiding layer in which the AlAs mole fraction (i.e., x) varies from 0.7 to 0.28 according to the parabolic distribution. Then, closing and opening of the shutter of the Al cell are repeated so as to grow the superlatticed quantum well region 15 for laser oscillation which is composed of alternate layers consisting of a plurality of GaAs layers (the thickness of each layer being equal to a five molecular layer thickness) and a plurality of $Al_{0.28}Ga_{0.72}As$ layers (the thickness of each layer being two molecular layers. Then, the shutter of the Al cell is opened and the temperature of the Al cell is raised, resulting in the GRIN region 6 functioning as an optical guiding layer in which the AlAs mole fraction (i.e., x) varies from 0.28 to 0.7 according to the parabolic distribution. Then, the shutter of a Be cell for supplying Be molecules is opened so as to grow the p-$Al_{0.7}Ga_{0.3}As$ cladding layer 7. According to the above-mentioned molecular beam epitaxial growth technique, a visible-laser light oscillation-operating area can be constructed using a single Al cell such that the superlatticed quantum well region 15 is sandwiched between the GRIN regions 4 and 6, on the outer sides of both of which the cladding layers 3 and 7 are formed.

Then, a striped channel having a width of 5 μm is formed in the current blocking layer 9 by an etching technique using an HF etchant, resulting in a striped structure, within which current is confined. The position of the above-mentioned laser oscillation operating area corresponds to this current-confining striped structure. Then, the back face of the n-GaAs substrate 1 and the upper face of the current blocking layer 9 including the p-GaAs cap layer 8 are subjected to a vapor deposition treatment with materials of Au-Ge-Ni and Au-Zn, respectively, followed by heating to form an n-sided electrode of an alloy of Au-Ge-Ni and a p-sided electrode of an alloy of Au-Zn, respectively, resulting in a semiconductor laser device.

When a driving current was injected into the semiconductor laser device through the p-sided electrode and the n-sided electrode, a visible laser light with a wavelength of 785 nm was continuously emitted from the laser-oscillation operating area at a threshold current of 48 mA at room temperature.

In the same manner as mentioned above, a semiconductor laser device having a cavity length of 250 μm (the whole area of the upper face of the wafer is covered by a p-sided electrode) was also attained. The semiconductor laser device produced laser light at an extremely low threshold current level of 368 A/cm$^2$.

EXAMPLE 2

Figure 3:
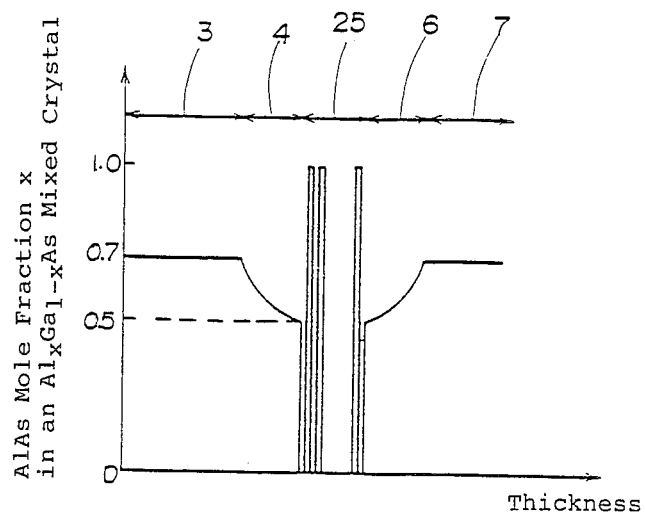
FIG. 3 is a graph showing the AlAs mole fraction (i.e., x) in an $Al_xGa_{1-x}As$ mixed crystal in the active region of another semiconductor laser device of this invention.

FIG. 3 shows the AlAs mole fraction in the active region of another semiconductor laser device of this invention, in which the superlatticed quantum well region 25 is constituted by a GaAs/AlAs superlatticed layer with a thickness of about 76 Å which is composed of alternate layers consisting of eight GaAs layers with the 6 Å thickness each and seven AlAs layers with the 4 Å thickness each. In the same manner as in Example 1, after the GRIN region 4 is grown, when the shutter of the Al cell is closed, the GaAs layer having a thickness of 6 Å is formed. Thereafter, when the shutter of the Al cell is opened and at the same time the shutter of the Ga cell is closed, the AlAs layer having a thickness of 4 Å is formed. By repeating the opening and closing of the shutters of the Al cell and the Ga cell, the GaAs/AlAs superlatticed layer can be formed. The laser oscillation-operating area obtained has a structure in which the superlatticed quantum well region 25 is sandwiched between the GRIN regions 4 and 6, on the outer sides of both of which the cladding layers 3 and 7, respectively, are further disposed. The structure of other device portions of this semiconductor laser device is the same as that of the laser device of Example 1.

As mentioned above, the layers (each of which has a thickness corresponding to several molecules or less) constituting a superlatticed structure are selected from an AlGaAs crystal or an AlAs crystal and are alternatively different in thickness, which allows the control of the energy-band structure to be created in the superlatticed layer, thereby attaining the prevention of a decrease in the efficiency of the carrier injection into the superlatticed quantum well layer. In contrast, with a conventional multi-quantum well structure constituted by layers each of which has a thickness of several ten angstroms, such a decrease in the efficiency of the carrier injection cannot be attained. Moreover, according to this invention, by changing in the total thickness of the quantum well layer, the quantization level to be formed within the superlatticed layer can be controlled, so that the optimum value of the oscillation wavelength and/or the threshold current can be controlled in the wide range. Moreover, the semiconductor laser device is produced by molecular beam epitaxy using a single Al cell, which makes the molecular beam epitaxial growth apparatus simple.

EXAMPLE 3

Although the whole area of the optical guiding layer was constituted by the GRIN layer in Examples 1 and 2, this example discloses a semiconductor laser device designed such that only a part of the optical guiding layer is constituted by the GRIN layer.

Figure 4:
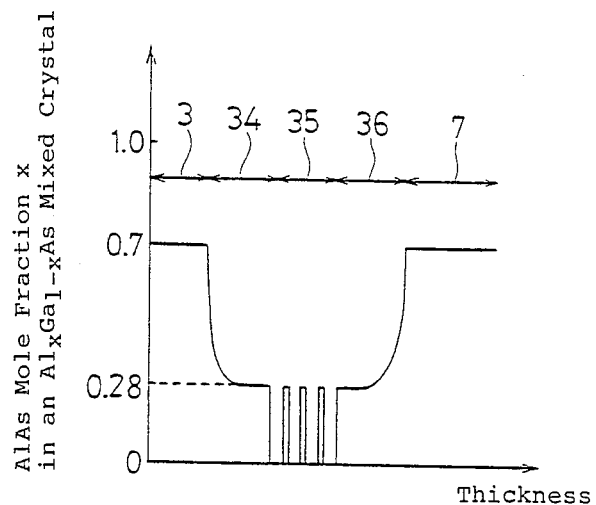
FIG. 4 is a graph showing the AlAs mole fraction (i.e., x) in an $Al_xGa_{1-x}As$ mixed crystal in the active region of another semiconductor laser device of this invention.
Figure 5:
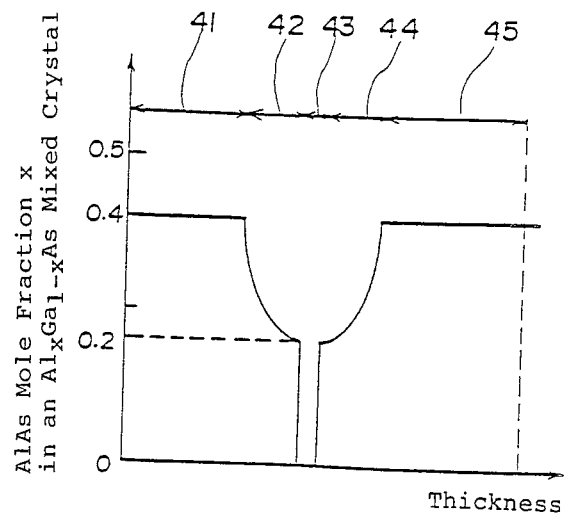
FIG. 5 is a graph showing the AlAs mole fraction (i.e., x) in an $Al_xGa_{1-x}As$ mixed crystal of a conventional GRIN-SCH semiconductor laser device having an oscillation wavelength in the infrared region.
Figure 6:
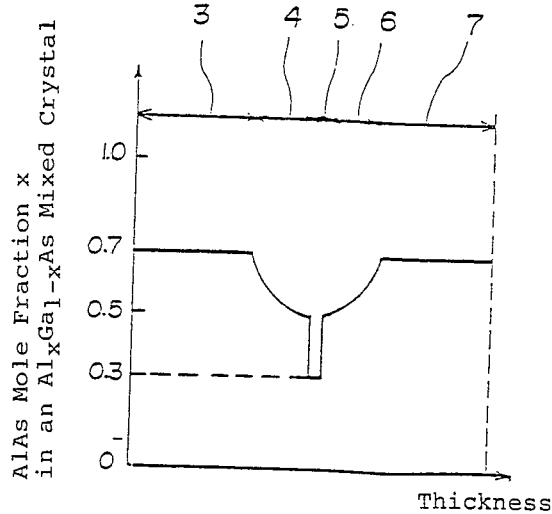
FIG. 6 is a graph showing the AlAs mole fraction (i.e., x) in an $Al_xGa_{1-x}As$ mixed crystal of a conventional GRIN-SCH semiconductor laser device having an oscillation wavelength in the visible region.

FIG. 4 shows another semiconductor laser device of this invention in which a part of each of the optical guiding layers 34 and 36 is constituted by the GRIN layer and the AlAs mole fraction in the area of each of the optical guiding layers 34 and 36 which comes into contact with the superlatticed quantum well region 35 is lowered as much as that in the superlatticed quantum well region 35, which makes possible crystal growth by a single Al cell, as well. The quantum well region 35 shown in FIG. 4 is formed by a superlatticed structure which is composed of alternate layers consisting of a plurality of GaAs layers (each of which has a five molecular layer thickness) and a plurality of $Al_{0.28}Ga_{0.72}As$ layers (each of which has a two molecular layer thickness). On this quantum well region 35, the optical guiding layers 34 and 36 are superposed. The AlAs mole fraction in each of the optical guiding layers 34 and 36 changes in the range of 0.28 to 0.7. The area of the optical guiding layer 34 positioned near the interface between the optical guiding layer 34 and the cladding layer 3 is constituted by a GRIN layer, the AlAs mole fraction of which changes greatly. The area of the optical guiding layer 36 positioned near the interface between the optical guiding layer 36 and the cladding layer 7 is also constituted by a GRIN layer, the AlAs mole fraction of which changes greatly. On the other hand, the AlAs mole fraction in the area of each of the optical guiding layers 34, 36 positioned near the quantum well region 35 is set to be almost same as that in the quantum well region 35.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. In a semiconductor laser device containing a laser oscillation-operating area, the device wherein said laser oscillation-operating area comprises:

a superlatticed quantum well region which is composed of alternate layers consisting of GaAs layers and thin $Al_xGa_{1-x}As$ ($0 < x \leq 1$) layers, each of said layers having a thickness of several molecular layers or less, optical guiding layers consisting of $Al_yGa_{1-y}As$ ($x \leq y \leq 1$) and sandwiching said superlatticed quantum well region therebetween, the AlAs mole fraction (i.e., y) of each said optical guiding layers being continuously varied, and cladding layers superposed on said optical guiding layers, respectively.

2. A semiconductor laser device according to claim 1, wherein the whole area of each of said optical guiding layers is constituted by a GRIN region, the AlAs mole fraction of which varies.

3. A semiconductor laser device according to claim 1, wherein the area of each of said optical guiding layers positioned in the vicinity of the interface between the optical guiding layers and the cladding layers is constituted by a GRIN region, the AlAs mole fraction of which is greatly different and the AlAs mole fraction in the area of each of said optical guiding layers positioned in the vicinity of said quantum well region is the same as that in said quantum well region.

* * * * *